United States Patent
Lee et al.

(10) Patent No.: US 8,437,137 B2
(45) Date of Patent: May 7, 2013

(54) FIXING MECHANISM FOR FIXING A THERMAL MODULE ON A BASE AND RELATED ELECTRONIC DEVICE

(75) Inventors: Lin-Yu Lee, Taipei County (TW); Shang-Chih Yang, Changhua County (TW)

(73) Assignee: MSI Computer (Shenzhen) Co., Ltd., Baoan District, Shenzhen, Guangdong Province (TW)

( * ) Notice: Subject to any disclaimer, the term of this patent is extended or adjusted under 35 U.S.C. 154(b) by 255 days.

(21) Appl. No.: 12/910,842

(22) Filed: Oct. 24, 2010

(65) Prior Publication Data

US 2012/0044648 A1  Feb. 23, 2012

(30) Foreign Application Priority Data

Aug. 20, 2010  (TW) .............................. 99216110 U

(51) Int. Cl.
*H05K 7/20* (2006.01)
*F28F 7/00* (2006.01)
*H01L 23/34* (2006.01)

(52) U.S. Cl.
USPC .......... 361/719; 361/704; 165/80.3; 165/185; 257/719

(58) Field of Classification Search ........................ None
See application file for complete search history.

(56) References Cited

U.S. PATENT DOCUMENTS

| | | | | |
|---|---|---|---|---|
| 5,757,621 | A * | 5/1998 | Patel .............................. | 361/719 |
| 6,212,074 | B1 * | 4/2001 | Gonsalves et al. ............ | 361/717 |
| 6,501,018 | B2 * | 12/2002 | Mayer ........................... | 174/370 |
| 6,545,879 | B1 * | 4/2003 | Goodwin ....................... | 361/807 |
| 6,611,431 | B1 * | 8/2003 | Lee et al. ....................... | 361/719 |
| 6,614,659 | B2 * | 9/2003 | Feigenbaum et al. ......... | 361/719 |
| 6,697,263 | B2 * | 2/2004 | Szu ................................ | 361/816 |
| 7,193,851 | B2 * | 3/2007 | Yatskov ......................... | 361/710 |
| 7,283,364 | B2 * | 10/2007 | Refai-Ahmed et al. ...... | 361/719 |
| 7,474,530 | B2 * | 1/2009 | Stewart et al. ................ | 361/704 |
| 7,498,673 | B2 * | 3/2009 | Awad et al. ................... | 257/718 |
| 7,978,475 | B2 * | 7/2011 | Urai .............................. | 361/719 |
| 2006/0245165 | A1 * | 11/2006 | Lin ................................ | 361/704 |

* cited by examiner

Primary Examiner — Boris Chervinsky
(74) Attorney, Agent, or Firm — Winston Hsu; Scott Margo

(57) ABSTRACT

A fixing mechanism for fixing a thermal module on a base includes a U-shaped buckling component disposed on a side of the base for buckling a thermal fin and a heat conducting block of the thermal module, and a fixing component disposed on the other side of the base and connected to the U-shaped buckling component for clipping the base with the U-shaped buckling component.

14 Claims, 2 Drawing Sheets

FIXING MECHANISM FOR FIXING A THERMAL MODULE ON A BASE AND RELATED ELECTRONIC DEVICE

BACKGROUND OF THE INVENTION

1. Field of the Invention

The present invention relates to a fixing mechanism for fixing a thermal module, and more particularly, to a fixing mechanism for buckling on a thermal module so as to fix the thermal module on a base and a related electronic device.

2. Description of the Prior Art

A conventional fixing mechanism for fixing a thermal module is disposed on a bottom of the thermal module on a circuit board. The conventional fixing mechanism may be overheated by a heat source disposed on the circuit board due to improper operation by a user, and a fixing component of the fixing mechanism for fixing the thermal module on the circuit is easy to be fused resulting in separating the thermal module from the circuit board. Therefore, service cost of the conventional fixing mechanism is increased. Thus, design of a fixing mechanism capable of transmitting heat generated by the circuit board to the thermal module without fusing the fixing component is an important issue of the electronic industry.

SUMMARY OF THE INVENTION

The present invention provides a fixing mechanism for fixing a thermal module on a base for solving above drawbacks.

According to the claimed invention, a fixing mechanism for fixing a thermal module on a base, the fixing mechanism includes a U-shaped buckling component disposed on a side of the base and buckling a thermal fin and a heat conducting block of the thermal module, and a fixing component disposed on the other side of the base and connected to the U-shaped buckling component for clipping the base with the U-shaped buckling component, so as to constrain relative movement of the base and the thermal module.

According to the claimed invention, a wedging structure is disposed on a side of the U-shaped buckling component, a sliding slot is formed on a side of the thermal fin, and the wedging structure is wedged inside the sliding slot for fixing the U-shaped buckling component on the thermal fin.

According to the claimed invention, the U-shaped buckling component is disposed on the thermal fin in a slidable manner.

According to the claimed invention, two sides of the U-shaped buckling component respectively align with two corresponding sides of the heat conducting block of the thermal module.

According to the claimed invention, the U-shaped buckling component is fixed on the heat conducting block.

According to the claimed invention, the fixing mechanism further includes a locking component for locking the fixing component on the U-shaped buckling component.

According to the claimed invention, the locking component is a spring screw.

According to the claimed invention, an electronic device includes a base, and a thermal module. The thermal module includes a thermal fin, and a heat conducting block disposed on a side of the thermal fin. The electronic device further includes a fixing mechanism for fixing the thermal module on the base. The fixing mechanism includes a U-shaped buckling component disposed on a side of the base and buckling the thermal fin and the heat conducting block, and a fixing component disposed on the other side of the base and connected to the U-shaped buckling component for clipping the base with the U-shaped buckling component, so as to constrain relative movement of the base and the thermal module.

According to the claimed invention, the sliding slot is formed on the side of the thermal fin, and the wedging structure of the U-shaped buckling component is wedged inside the sliding slot, so that the U-shaped buckling component can be disposed on the thermal fin of the thermal module in the slidable manner for increasing stability of the thermal module installed on the base and for preventing the thermal module from separating due to the user's improper operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
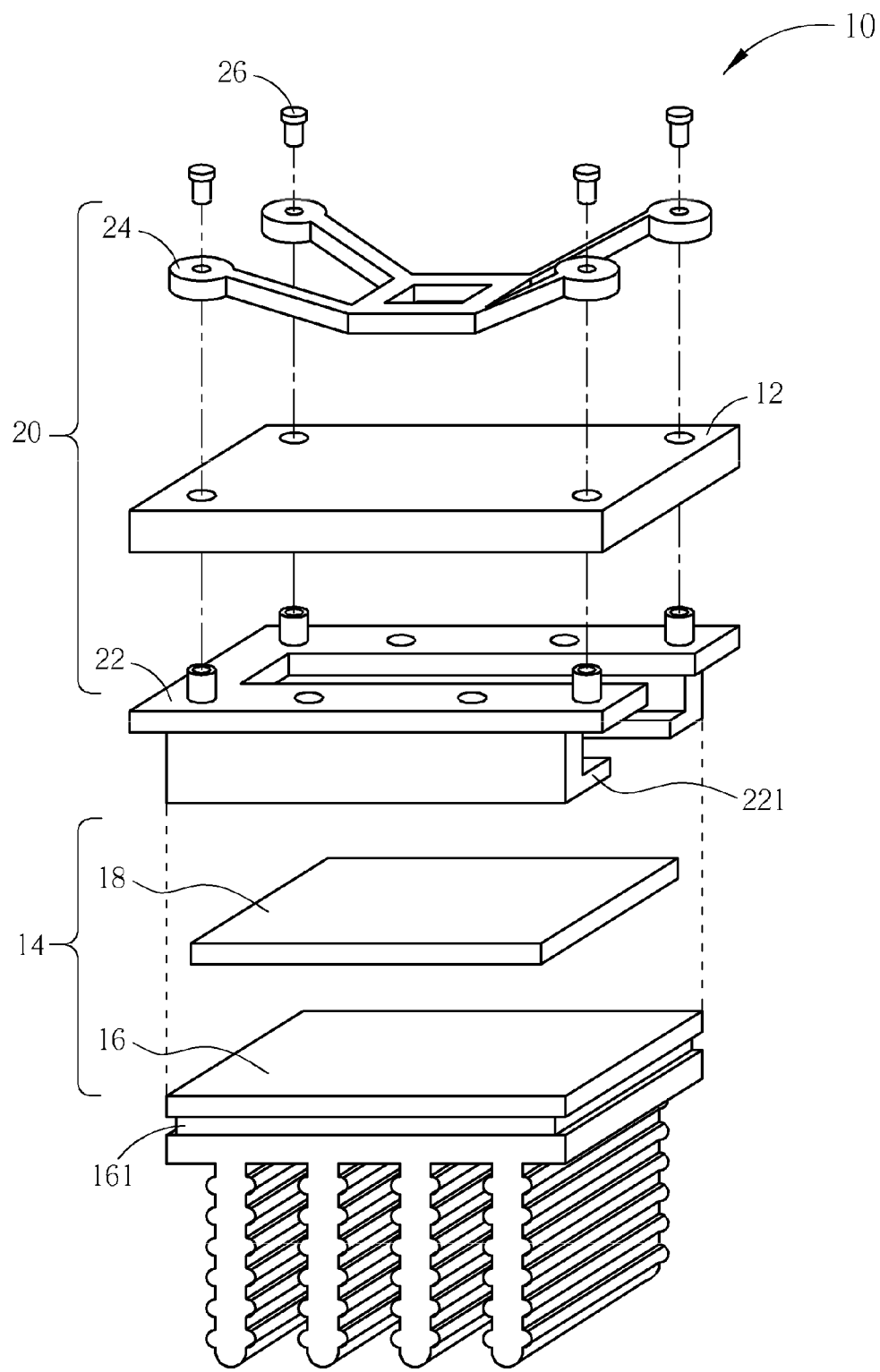
FIG. 1 is an exploded diagram of an electronic device according to a preferred embodiment of the present invention.
Figure 2:
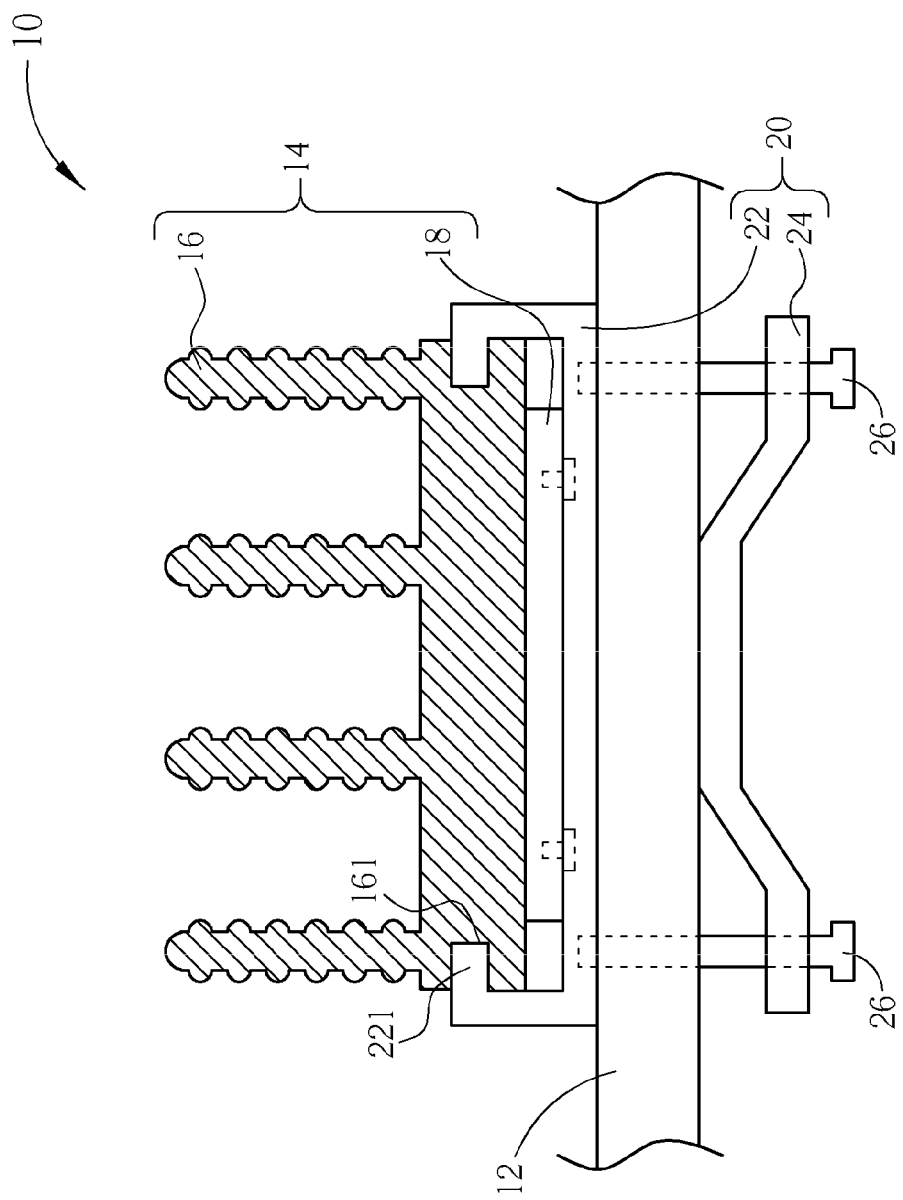
FIG. 2 is a sectional view of the electronic device according to the preferred embodiment of the present invention.

Please refer to FIG. 1 and FIG. 2. FIG. 1 is an exploded diagram of an electronic device 10 according to a preferred embodiment of the present invention. FIG. 2 is a sectional view of the electronic device 10 according to the preferred embodiment of the present invention. The electronic device 10 includes a base 12, and the base 12 can be a circuit board. The electronic device further includes a thermal module 14 for dissipating heat generated by electronic components disposed on the circuit board 12. The thermal module 14 includes a thermal fin 16, and a heat conducting block 18 disposed on a side of the thermal fin 16. The electronic device 10 further includes a fixing mechanism 20 for fixing the thermal module 14 on the base 12. The fixing mechanism 20 includes a U-shaped buckling component 22 disposed on a side of the base 12 and buckling the thermal fin 16 and the heat conducting block 18. The U-shaped buckling component 22 can be disposed on the thermal fin 16 in a slidable manner. For example, a wedging structure 221 can be disposed on a side of the U-shaped buckling component 22, a sliding slot 161 can be formed on a side of the thermal fin 16, and the sliding slot 161 is substantially parallel to a side of the heat conducting block 18, so that the wedging structure 221 can be wedged inside the sliding slot 161 for fixing the U-shaped buckling component 22 on the thermal fin 16. When the wedging structure 221 of the U-shaped buckling component 22 slides inside the sliding slot 161 of the thermal fin 16, two sides of the U-shaped buckling component 22 respectively align with two corresponding sides of the heat conducting block 18, and the U-shaped buckling component 22 can be locked on the heat conducting block 18 for promoting stability of the fixing mechanism 20.

In addition, the fixing mechanism 20 further includes a fixing component 24 disposed on the other side of the base 12 and connected to the U-shaped buckling component 22 for clipping the base 12 with the U-shaped buckling component 22, so as to constrain relative movement of the base 12 and the thermal module 14. The fixing mechanism 20 can further include a locking component 26 for locking the fixing component 24 on the U-shaped buckling component 22. Generally, the locking component 26 can be a spring screw. Therefore, when the U-shaped buckling component 22 buckles the thermal fin 16 and the heat conducting block 18, the fixing component 24 can clip the base 12 with the U-shaped buckling component 22 via the locking component 26, so as to press the base 12 close to the heat conducting block 18 for preferable heat dissipating efficiency.

In conclusion, as a user utilizes the fixing mechanism 20 to assemble the thermal module 14 on the base 12, the wedging structure 221 of the U-shaped buckling component 22 is inserted into the sliding slot 161 on the thermal fin 16, and the U-shaped buckling component 22 slides relative to the heat conducting block 18 to a predetermined position, which means the two sides of the U-shaped buckling component 22 respectively align with the two corresponding sides of the heat conducting block 18 and the U-shaped buckling component 22 covers the heat conducting block 18 tightly, for locking the U-shaped buckling component 22 on the heat conducting block 18. Then, the base 12 is placed between the U-shaped buckling component 22 and the fixing component 24, and the locking component 26 passes through a locking hole on the fixing component 24 and an opening hole on the base 12, so that the fixing component 24 is locked with the U-shaped buckling component 22. The fixing component 24 can clip the base 12 with the U-shaped buckling component 22 via the locking component 26, so that the base 12 is pressed for closing to the heat conducting block 18 for preferable heat dissipating efficiency. Generally, thermal grease, such as hypothermia solder paste, can be laid between the heat conducting block 18 and the base 12 for dissipating the heat generated by the electronic components disposed on the base 12, together with the thermal fin 16 and the heat conducting block 18.

Comparing to the prior art, the fixing mechanism of the present invention buckles the thermal module for connecting the thermal module to the base. In this present invention, the sliding slot is formed on the side of the thermal fin, and the wedging structure of the U-shaped buckling component is wedged inside the sliding slot, so that the U-shaped buckling component can be disposed on the thermal fin of the thermal module in the slidable manner for increasing stability of the thermal module installed on the base and for preventing the thermal module from separating due to the user's improper operation.

Those skilled in the art will readily observe that numerous modifications and alterations of the device and method may be made while retaining the teachings of the invention.

What is claimed is:

1. A fixing mechanism for fixing a thermal module on a base, the fixing mechanism comprising:
    a U-shaped buckling component disposed on a side of the base and slidably buckling a thermal fin and a heat conducting block of the thermal module, the U-shaped buckling component comprising:
        two hook portions, each hook portion comprising a bottom and two lateral walls, the lateral walls being respectively disposed on opposite sides of the bottom, the thermal module sliding into the hook portion along a direction substantially perpendicular to a planer normal vector of the bottom, and the two hook portions simultaneously buckling opposite edges of the thermal module;
    a fixing component disposed on the other side of the base and connected to the U-shaped buckling component for clipping the base with the U-shaped buckling component, so as to constrain relative movement of the base and the thermal module; and
    at least one locking component for fixing the heat conducting block on an inner surface of the U-shaped buckling component.

2. The fixing mechanism of claim 1, wherein a wedging structure is disposed on a side of the U-shaped buckling component, a sliding slot is formed on a side of the thermal fin, and the wedging structure is wedged inside the sliding slot for fixing the U-shaped buckling component on the thermal fin.

3. The fixing mechanism of claim 2, wherein the U-shaped buckling component is disposed on the thermal fin in a slidable manner.

4. The fixing mechanism of claim 1, wherein two sides of the U-shaped buckling component respectively align with two corresponding sides of the heat conducting block of the thermal module.

5. The fixing mechanism of claim 1, wherein the U-shaped buckling component is fixed on the heat conducting block.

6. The fixing mechanism of claim 1, further comprising:
    a locking component for locking the fixing component on the U-shaped buckling component.

7. The fixing mechanism of claim 6, wherein the locking component is a spring screw.

8. An electronic device comprising:
    a base;
    a thermal module comprising:
        a thermal fin; and
        a heat conducting block disposed on a side of the thermal fin; and
    a fixing mechanism for fixing the thermal module on the base, the fixing mechanism comprising:
        a U-shaped buckling component disposed on a side of the base and slidably buckling the thermal fin and the heat conducting block, the U-shaped buckling component comprising:
            two hook portions, each hook portion comprising a bottom and two lateral walls, the lateral walls being respectively disposed on opposite sides of the bottom, the thermal module sliding into the hook portion along a direction substantially perpendicular to a planer normal vector of the bottom, and the two hook portions simultaneously buckling opposite edges of the thermal module;
        a fixing component disposed on the other side of the base and connected to the U-shaped buckling component for clipping the base with the U-shaped buckling component, so as to constrain relative movement of the base and the thermal module; and
        at least one locking component for fixing the heat conducting block on an inner surface of the U-shaped buckling component.

9. The electronic device of claim 8, wherein a wedging structure is disposed on a side of the U-shaped buckling component, a sliding slot is formed on a side of the thermal fin, and the wedging structure is wedged inside the sliding slot for fixing the U-shaped buckling component on the thermal fin.

10. The electronic device of claim 9, wherein the U-shaped buckling component is disposed on the thermal fin in a slidable manner.

11. The electronic device of claim 8, wherein two sides of the U-shaped buckling component respectively align with two corresponding sides of the heat conducting block of the thermal module.

12. The electronic device of claim 8, wherein the U-shaped buckling component is fixed on the heat conducting block.

13. The electronic device of claim 8, wherein the fixing mechanism further comprises a locking component for locking the fixing component on the U-shaped buckling component.

14. The electronic device of claim 13, wherein the locking component is a spring screw.

\* \* \* \* \*